(12) United States Patent
Camacho et al.

(10) Patent No.: US 8,134,242 B2
(45) Date of Patent: Mar. 13, 2012

(54) INTEGRATED CIRCUIT PACKAGE SYSTEM WITH CONCAVE TERMINAL

(75) Inventors: Zigmund Ramirez Camacho, Singapore (SG); Arnel Senosa Trasporto, Singapore (SG); Reza Argenty Pagaila, Singapore (SG); Lionel Chien Hui Tay, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 656 days.

(21) Appl. No.: 12/185,616

(22) Filed: Aug. 4, 2008

(65) Prior Publication Data
US 2010/0029046 A1 Feb. 4, 2010

(51) Int. Cl.
*H01L 23/28* (2006.01)
(52) U.S. Cl. ............ 257/787; 257/730; 257/E23.125
(58) Field of Classification Search .............. 257/787
See application file for complete search history.

(56) References Cited

U.S. PATENT DOCUMENTS

| | | | |
|---|---|---|---|
| 5,962,918 A * | 10/1999 | Kimura | ............... 257/738 |
| 6,001,671 A | 12/1999 | Fjelstad | |
| 6,072,239 A | 6/2000 | Yoneda et al. | |
| 6,329,711 B1 | 12/2001 | Kawahara et al. | |
| 6,333,252 B1 | 12/2001 | Jung et al. | |
| 6,498,099 B1 | 12/2002 | McLellan et al. | |
| 6,528,877 B2 | 3/2003 | Ernst et al. | |
| 6,528,893 B2 | 3/2003 | Jung et al. | |
| 6,635,957 B2 | 10/2003 | Kwan et al. | |
| 6,770,959 B2 | 8/2004 | Huang et al. | |
| 6,774,499 B1 | 8/2004 | Yang | |
| 6,933,594 B2 | 8/2005 | McLellan et al. | |
| 6,969,905 B2 | 11/2005 | Paulus | |
| 7,049,177 B1 | 5/2006 | Fan et al. | |
| 2006/0060981 A1 | 3/2006 | Paulus | |
| 2007/0090495 A1 | 4/2007 | Kim et al. | |

* cited by examiner

*Primary Examiner* — Steven Loke
*Assistant Examiner* — Kimberly M Thomas
(74) *Attorney, Agent, or Firm* — Mikio Ishimaru

(57) ABSTRACT

An integrated circuit package system includes: connecting a concave terminal and an integrated circuit; and forming an encapsulation, having a bottom side, over the integrated circuit and the concave terminal with the concave terminal within the encapsulation.

20 Claims, 5 Drawing Sheets

INTEGRATED CIRCUIT PACKAGE SYSTEM WITH CONCAVE TERMINAL

TECHNICAL FIELD

The present invention relates generally to an integrated circuit package system and more particularly to an integrated circuit package system having an encapsulation.

BACKGROUND ART

Modern consumer electronics, such as smart phones, personal digital assistants, and location based services devices, as well as enterprise electronics, such as servers and storage arrays, are packing more integrated circuits into an ever-shrinking physical space with expectations for decreasing cost. Numerous technologies have been developed to meet these requirements. Some of the research and development strategies focus on new package technologies while others focus on improving the existing and mature package technologies.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact locking terminals or pads formed directly on the surface of the package.

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

In the manufacturing process, many obstacles must be overcome to deliver extremely small packages with thinner and thinner profile in high volume. Typical semiconductor packages face problems providing the high density and high count I/O needed for modern electronic products.

Thus, a need still remains for an integrated circuit package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: connecting a concave terminal and an integrated circuit; and forming an encapsulation, having a bottom side, over the integrated circuit and the concave terminal with the concave terminal within the encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
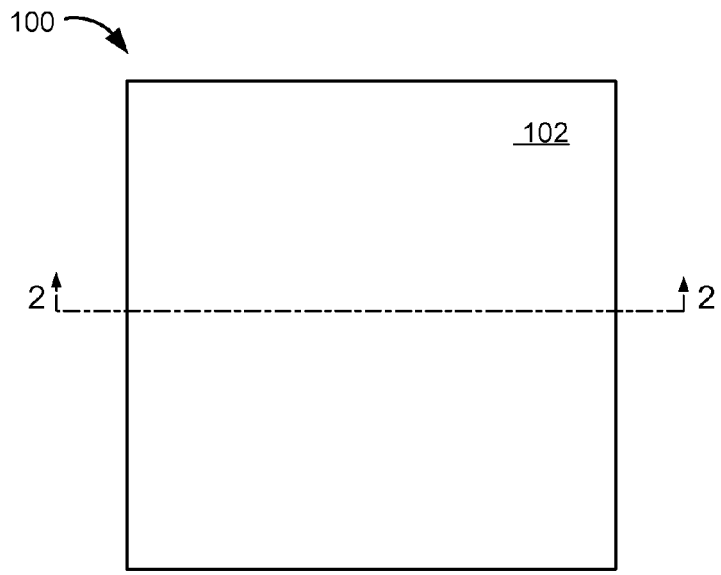
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an encapsulation 102, such as a cover of an epoxy molding compound.

For illustrative purposes, the integrated circuit package system 100 is shown with a square geometric configuration, although it is understood that the integrated circuit package system 100 can be formed in a different geometric configuration. For example, the integrated circuit package system 100 can have a rectangular configuration.

Figure 2:
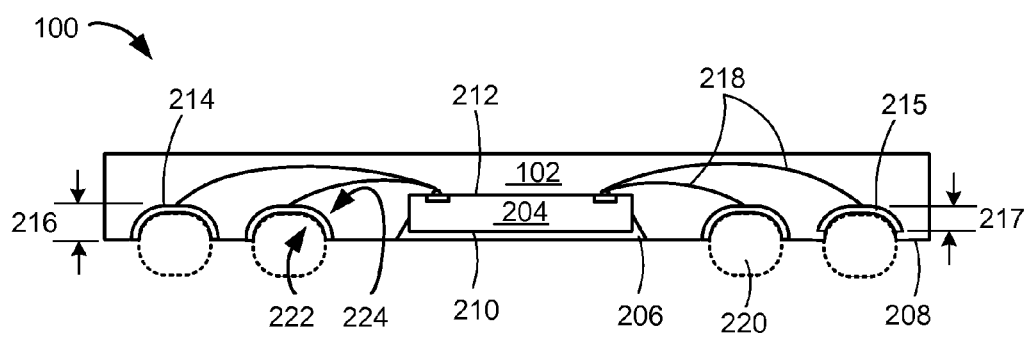
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts an integrated circuit 204, such as an integrated circuit die, over an adhesive 206, such as a die-attach adhesive. The adhesive 206 can be exposed by a bottom side 208 of the encapsulation 102. The integrated circuit 204 includes a non-active side 210 and an active side 212, wherein the active side 212 includes active circuitry fabricated thereon. The non-active side 210 faces the bottom side 208 of the encapsulation 102.

For illustrative purposes, the integrated circuit package system 100 is shown with the integrated circuit 204, although it is understood that the integrated circuit package system 100 can have different devices. For example, the integrated circuit package system 100 can have a stack of integrated circuits.

Concave terminals 214 can be adjacent to the integrated circuit 204 along the periphery of the integrated circuit package system 100. The concave terminals 214 are non-planar with the bottom side 208. The concave terminals 214 can be planar with the bottom side 208 and concaved into the encapsulation 102. The concave terminals 214 can have a terminal height 216 that extends to and from the bottom side 208 of the encapsulation 102.

Another example of the concave terminals 214 can be interlocking concave terminals 215. The interlocking concave terminals 215 can have an interlocking height 217 that is non-planar with the bottom side 208 of the encapsulation 102. The encapsulation 102 below the interlocking concave terminals 215 can further secure the interlocking concave terminals 215. The integrated circuit package system 100 can include the concave terminals 214, the interlocking concave terminals 215, or a combination thereof.

For illustrative purposes, the integrated circuit package system 100 is shown with the concave terminals 214 with a semi-oval geometric configuration, although it is understood that the integrated circuit package system 100 can have the concave terminals 214 with different geometric configurations. The concave terminals 214 can have a curved inner surface 222 facing away from the encapsulation 102 and a curved outer surface 224 facing the encapsulation 102. For example, the concave terminals 214 can have a circular arch configuration or an inverted v-shaped configuration.

Also for illustrative purposes, the integrated circuit package system 100 is shown having two rows of the concave terminals 214, although it is understood that the integrated circuit package system 100 can have a different number of rows of the concave terminals 214. For example, the integrated circuit package system 100 can have one row or more than two rows of the concave terminals 214.

The concave terminals 214 can be formed of a single material and layer or can be formed with multiple layers. For example, the concave terminals 214 can be formed with gold (Au), palladium (Pd), nickel (Ni), silver (Ag), tin (Sn), an alloy, or any combination thereof.

Internal interconnects 218, such as bond wires or ribbon bond wires, can connect the active side 212 of the integrated circuit 204 and the concave terminals 214. The encapsulation 102 can cover the integrated circuit 204, the internal interconnects 218, and partially exposes the concave terminals 214.

Optionally, external interconnects 220, such as solder balls, depicted by dotted lines, can attach within the concave terminals 214 for connection to the next system level (not shown), such as a printed circuit board or another integrated circuit package system. The arched shape of the concave terminals 214 can facilitate alignment of the external interconnects 220 by aiding the solder balls fit into the concave terminals 214, improving solder ball attach yield and preventing bridging. The external interconnects 220 can be attached to the concave terminals 214 or attached to the next system level.

It has been discovered that the present invention provides the integrated circuit package system with improved reliability with the arched or concave shaped terminal structure. The concave terminals increases the adhesion strength between the concave terminals and the solder balls, and improves solder joint reliability (SJR) performance. The arched profile increases the contact area of the terminal material to the mold compound package body, reducing pad peeling or reducing delamination. The larger contact area from the arched configuration of the concave terminals provides a larger solder interface area to improve the stability of the solder ball attachment and improve board-level reliability. Furthermore, the arched structure also increases shear strength against the shear force.

For illustrative purposes, the integrated circuit package system 100 includes the internal interconnects 218 connecting to the same location of the integrated circuit 204, although it is understood that each of the internal interconnects 218 can connect to different portions of the integrated circuit 204.

Figure 3:
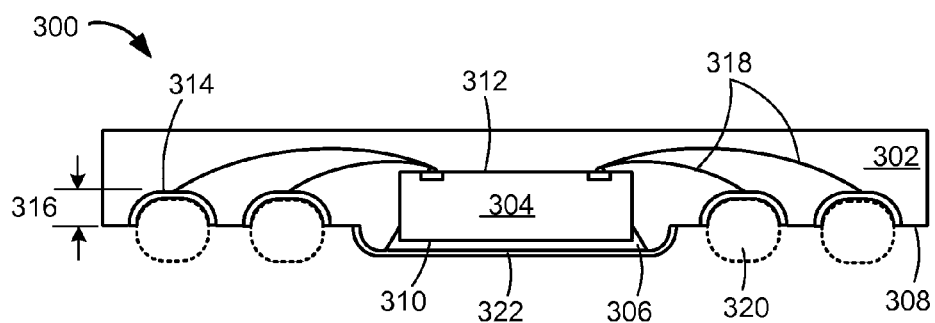
FIG. 3 is a cross-sectional view of an integrated circuit package system exemplified by the top view along ling 2-2 of FIG. 1 in a second embodiment of the present invention.

Referring now to FIG. 3, therein is shown a cross-sectional view of an integrated circuit package system 300 exemplified by the top view along ling 2-2 of FIG. 1 in a second embodiment of the present invention. The integrated circuit package system 300 includes structural similarities to the integrated circuit package system 100 of FIG. 2. The cross-sectional view depicts an integrated circuit 304, such as an integrated circuit die, over a paddle 322, such as a die-attach paddle, with an adhesive 306, such as a die-attach adhesive.

The integrated circuit 304 includes a non-active side 310 and an active side 312, wherein the active side 312 includes active circuitry fabricated thereon. The non-active side 310 faces a bottom side 308 of an encapsulation 302, such as cover including an epoxy molding compound. The paddle 322 can extend beyond the bottom side 308 of the encapsulation 302. The paddle 322 can have a convex configuration.

Concave terminals 314 can be adjacent to the integrated circuit 304 along the periphery of the integrated circuit package system 300. The concave terminals 314 are non-planar with the bottom side 308. The concave terminals 314 can extend to the bottom side 308 and concaved into the encapsulation 302. The concave terminals 314 can have a terminal height 316 from the bottom side 308 of the encapsulation 302.

The concave terminals 314 can be formed of a single material and layer or can be formed with multiple layers. For example, the concave terminals 314 can be formed with gold (Au), palladium (Pd), nickel (Ni), silver (Ag), tin (Sn), an alloy, or any combination thereof.

Internal interconnects 318, such as bond wires or ribbon bond wires, can connect the active side 312 of the integrated circuit 304 and the concave terminals 314. The encapsulation 302 can cover the integrated circuit 304, the internal interconnects 318, and partially exposes the concave terminals 314. The encapsulation 302 can also fill in the paddle 322.

Optionally, external interconnects 320, such as solder balls, depicted by dotted lines, can attach within the concave terminals 314 for connection to the next system level (not shown), such as a printed circuit board or another integrated circuit package system. The arched shape of the concave terminals 314 can facilitate alignment of the external interconnects 320 by aiding the solder balls fit into the concave terminals 314, improving solder ball attach yield and preventing bridging. The external interconnects 320 can be attached to the concave terminals 314 or attached to the next system level.

The external interconnects 320 can extend below the paddle 322 from the bottom side 308 of the encapsulation 302 preventing the paddle 322 from impeding connections of the external interconnects 320 to the next system level. The paddle 322 can attach to the next system level and function as a thermal sink or an electromagnetic interference (EMI) shield with the paddle 322 connected to a ground.

Figure 4:
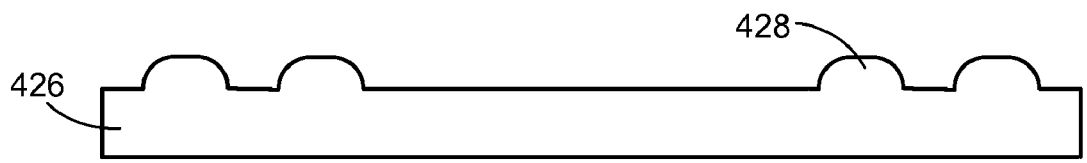
FIG. 4 is a cross-sectional view of a carrier.

Referring now to FIG. 4, therein is shown a cross-sectional view of a carrier 426. The carrier 426 can be formed from a number of materials, such as copper. The carrier 426 can include protrusions 428. The protrusions 428 can be formed by any number of methods. For example, the protrusions 428 can be formed by coining portions of the carrier 426 adjacent to the protrusions 428.

Figure 5:
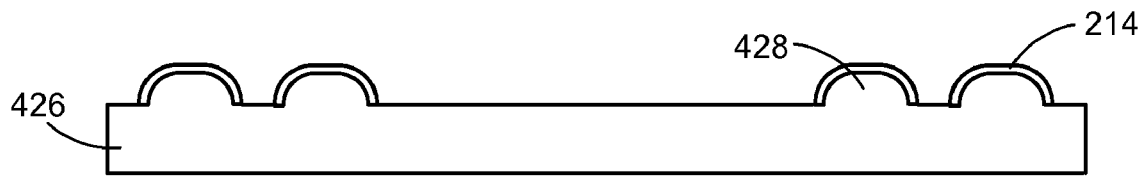
FIG. 5 is the structure of FIG. 4 in forming the concave terminals.

Referring now to FIG. 5, therein is shown the structure of FIG. 4 in forming of the concave terminals 214. The carrier 426 can serve as a support member or a plating current path that can be used in electroplating process. The concave terminals 214 can be formed by selectively plating the protrusions 428.

As another example, a masking layer (not shown) can be optional formed over the carrier 426 and between the protrusions 428. The interlocking concave terminals 215 of FIG.2 can be formed over the protrusions 428 without extending to the carrier 426 between the protrusions 428.

Figure 6:
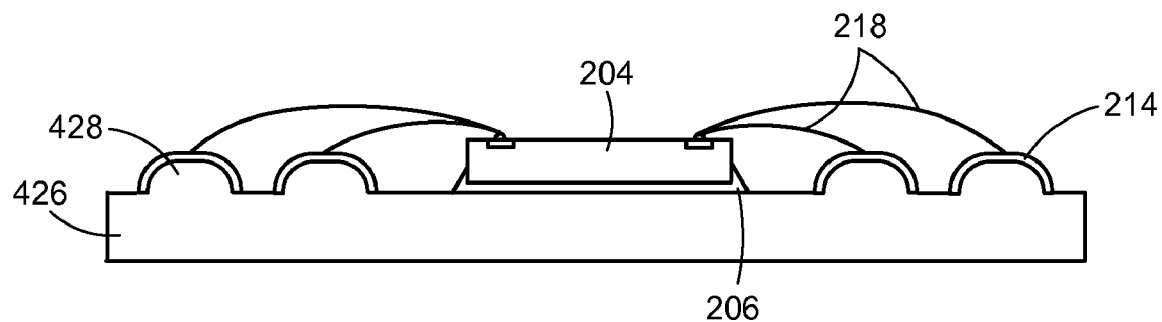
FIG. 6 is the structure of FIG. 5 in mounting and connecting the integrated circuit.

Referring now to FIG. 6, therein is shown the structure of FIG. 5 in mounting and connecting the integrated circuit 204. The integrated circuit 204 can be mounted over the carrier 426 with the adhesive 206. The internal interconnects 218 can connect the integrated circuit 204 and the concave terminals 214 formed over the protrusions 428.

Figure 7:
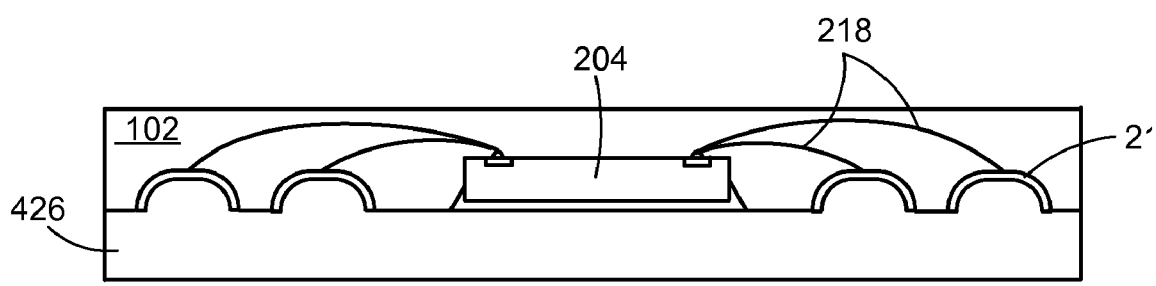
FIG. 7 is the structure of FIG. 6 in forming the encapsulation.

Referring now to FIG. 7, therein is shown the structure of FIG. 6 in forming the encapsulation 102. The encapsulation 102 can be over the carrier 426 covering the integrated circuit 204, the internal interconnects 218, the concave terminals 214.

Figure 8:
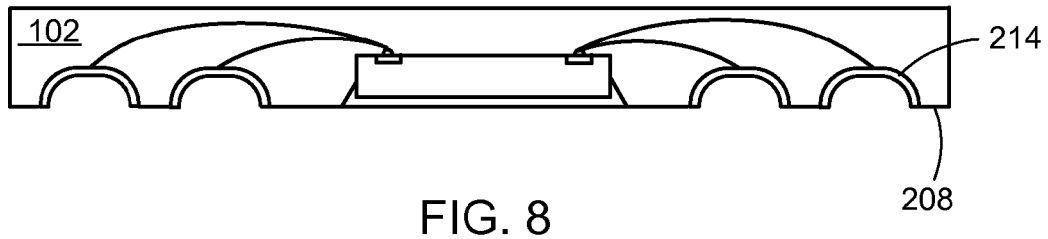
FIG. 8 is the structure of FIG. 7 in exposing the concave terminals.

Referring now to FIG. 8, therein is shown the structure of FIG. 7 in exposing the concave terminals 214. The structure of FIG. 7 can undergo a removal process, such as an etching process, removing the carrier 426 of FIG. 7 having the protrusions 428 of FIG. 7. The removal process can expose the concave terminals 214. The concave terminals 214 can extend inwards from the bottom side 208 of the encapsulation 102.

Figure 9:
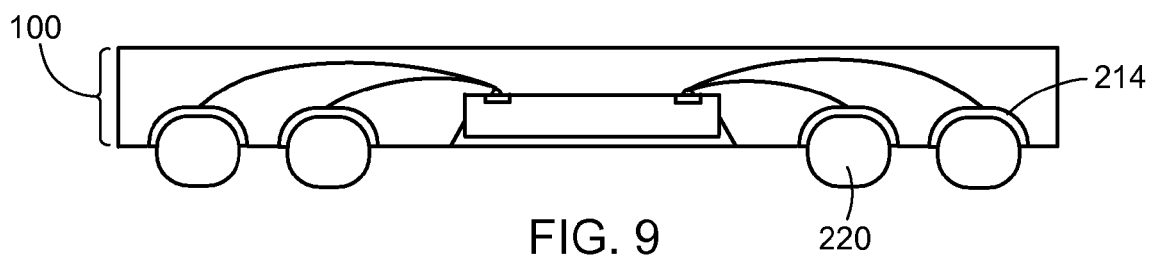
FIG. 9 is the structure of FIG. 7 in attaching the external interconnects.

Referring now to FIG. 9, therein is shown the structure of FIG. 8 in attaching the external interconnects 220. The external interconnects 220 are optionally attached as part of the integrated circuit package system 100 or can be attached to the integrated circuit package system 100 when mounting over the next system level (not shown). The external interconnects 220 can be attached to and within the concave terminals 214.

Figure 10:
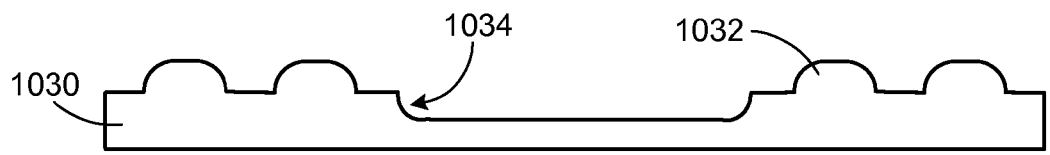
FIG. 10 is a cross-sectional view of a manufacturing carrier.

Referring now to FIG. 10, therein is shown a cross-sectional view of a carrier 1030. The carrier 1030 can be formed from a number of materials, such as copper. The carrier 1030 can include protrusions 1032 and a cavity 1034. The cavity 1034 can be between the protrusions 1032.

The protrusions 1032 can be formed by any number of methods. For example, the protrusions 1032 can be formed by coining portions of the carrier 1030 adjacent to the protrusions 1032. The cavity can be formed by any number of methods. For example, the cavity 1034 can be formed by half-etching a portion of the carrier 1030 without the protrusions 1032.

Figure 11:
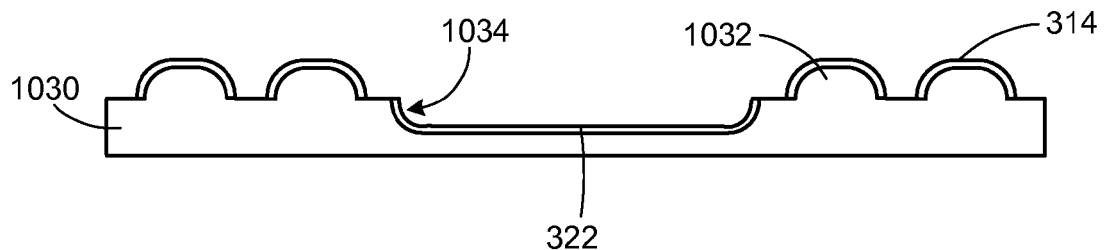
FIG. 11 is the structure of FIG. 10 in forming the paddle and concave terminals.

Referring now to FIG. 11, therein is shown the structure of FIG. 10 in forming of the paddle 322 and the concave terminals 314. The paddle 322 can be formed by selectively plating the cavity 1034. The concave terminals 314 can be formed by selectively plating the protrusions 1032.

Figure 12:
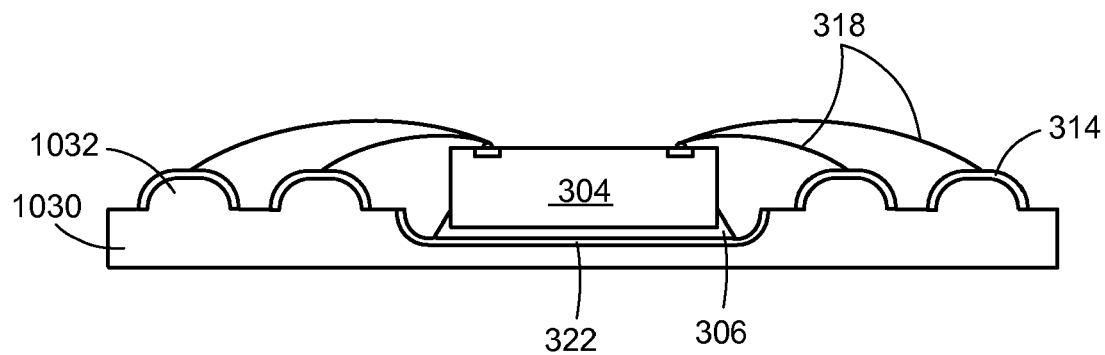
FIG. 12 is the structure of FIG. 11 in mounting and connecting the integrated circuit.

Referring now to FIG. 12, therein is shown the structure of FIG. 11 in mounting and connecting the integrated circuit 304. The integrated circuit 304 can be mounted partially within the paddle 322 with the adhesive 306. The internal interconnects 318 can connect the integrated circuit 304 and the concave terminals 314 over the protrusions 1032 of the carrier 1030.

Figure 13:
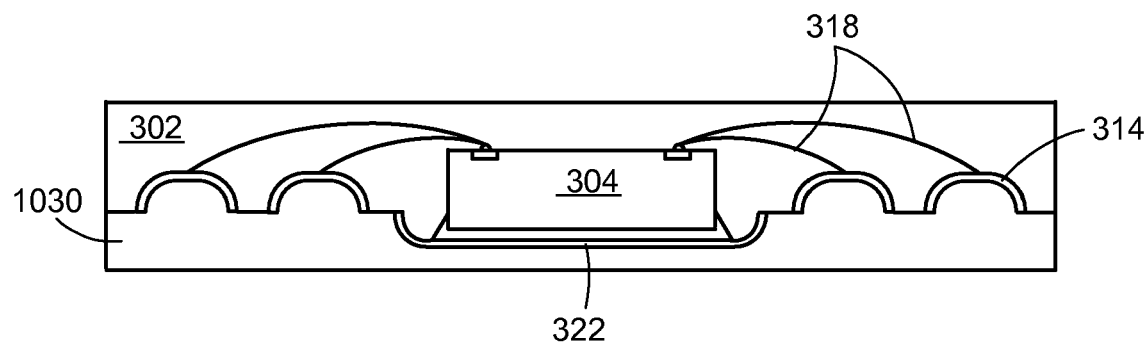
FIG. 13 is the structure of FIG. 12 in forming the encapsulation.

Referring now to FIG. 13, therein is shown the structure of FIG. 12 in forming the encapsulation 302. The encapsulation 302 can be over the carrier 1030 covering the integrated circuit 304, the internal interconnects 318, the paddle 322, and the concave terminals 314. The encapsulation 302 can fill the paddle 322.

Figure 14:
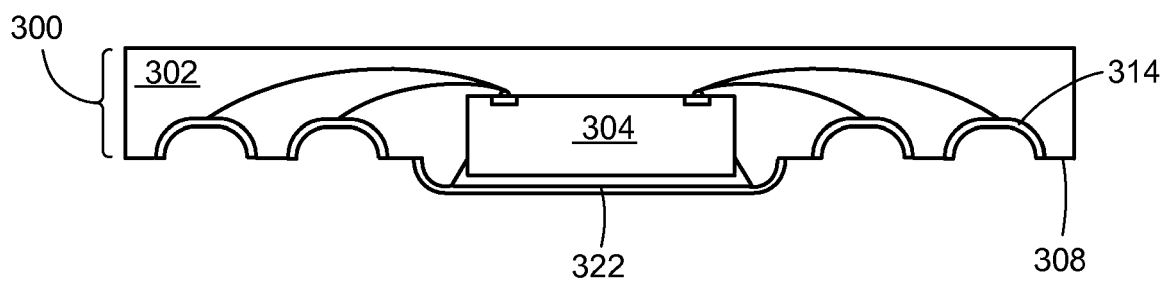
FIG. 14 is the structure of FIG. 13 in exposing the paddle and the concave terminals.

Referring now to FIG. 14, therein is shown the structure of FIG. 13 in exposing the paddle 322 and the concave terminals 314. The structure of FIG. 13 can undergo a removal process, such as an etching process, removing the carrier 1030 of FIG. 13 to expose the paddle 322 and the concave terminals 314. The concave terminals 314 can arch inward into the encapsulation 302. The paddle 322 can extend from the bottom side 308 of the encapsulation 302.

Figure 15:
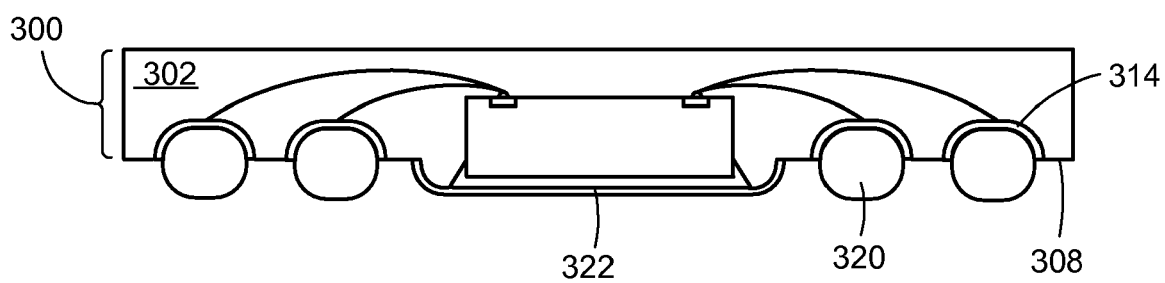
FIG. 15 is the structure of FIG. 14 in attaching the external interconnects.

Referring now to FIG. 15, therein is shown the structure of FIG. 14 in attaching the external interconnects 320. The external interconnects 320 are optionally attached as part of the integrated circuit package system 300 or can be attached to the integrated circuit package system 300 when mounting over the next system level (not shown). The external interconnects 320 can be attached to and within the concave terminals 314. The external interconnects 320 can extend from the bottom side 308 of the encapsulation 302 beyond an extension of the paddle 322 from the bottom side 308.

Figure 16:
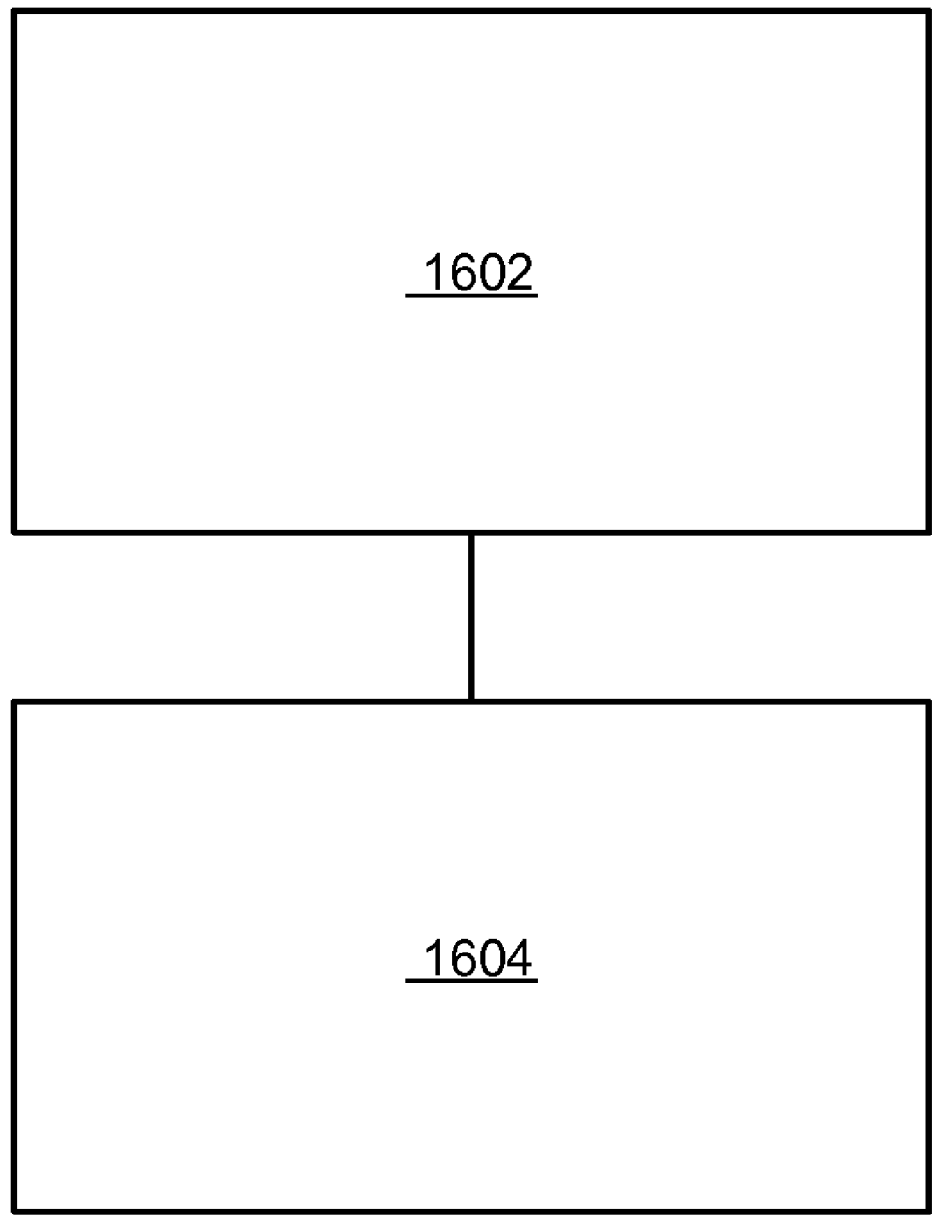
FIG. 16 is a flow chart of an integrated circuit package system for manufacture of the integrated circuit package system in an embodiment of the present invention.

Referring now to FIG. 16, therein is shown a flow chart of an integrated circuit package system 1600 for manufacture of the integrated circuit package system 100 in an embodiment of the present invention. The system 1600 includes connecting a concave terminal and an integrated circuit in a block 1602; and forming an encapsulation, having a bottom side, over the integrated circuit and the concave terminal with the concave terminal within the encapsulation in a block 1604.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of forming an integrated circuit package system comprising:
   connecting a concave terminal and an integrated circuit, the concave terminal having a curved inner surface and a curved outer surface; and
   forming an encapsulation, having a bottom side, over the integrated circuit and the concave terminal with the concave terminal within the encapsulation.

2. The method as claimed in claim 1 further comprising:
   forming a paddle;
   mounting the integrated circuit over the paddle; and
   wherein forming the encapsulation includes:
   filling the paddle with the encapsulation.

3. The method as claimed in claim 1 wherein forming the encapsulation with the concave terminal within the encapsulation includes surrounding the concave terminal arched within the encapsulation.

4. The method as claimed in claim 1 wherein forming the encapsulation with the concave terminal within the encapsulation and non-planar with the bottom side includes forming the encapsulation with the concave terminal non-planar with the bottom side.

5. The method as claimed in claim 1 further comprising forming an external interconnect partially within the concave terminal.

6. A method of forming an integrated circuit package system comprising:
   connecting a concave terminal and an integrated circuit, the concave terminal having a curved inner surface and a curved outer surface; and
   forming an encapsulation, having a bottom side, over the integrated circuit and the concave terminal with the concave terminal arched within the encapsulation and non-planar with the bottom side without extending beyond the bottom side.

7. The method as claimed in claim 6 further comprising:
   forming a paddle and the concave terminal with the paddle extended beyond the bottom side; and
   mounting the integrated circuit over the paddle.

8. The method as claimed in claim 6 further comprising:
   applying an adhesive; and
   mounting the integrated circuit over the adhesive.

9. The method as claimed in claim 6 further comprising:
   applying an adhesive;
   mounting the integrated circuit over the adhesive; and
   wherein forming the encapsulation includes:
   exposing the adhesive.

10. The method as claimed in claim 6 further comprising forming a paddle extended from the bottom side.

11. An integrated circuit package system comprising:
    a concave terminal having a curved inner surface and a curved outer surface;
    an integrated circuit connected with the concave terminal; and
    an encapsulation, having a bottom side, over the integrated circuit and the concave terminal with the concave terminal within the encapsulation.

12. The system as claimed in claim 11 further comprising a paddle with the integrated circuit thereover and the paddle filled with the encapsulation.

13. The system as claimed in claim 11 wherein the concave terminal arched within the encapsulation.

14. The system as claimed in claim 11 wherein the concave terminal non-planar with the bottom side of the encapsulation.

15. The system as claimed in claim 11 further comprising an external interconnect partially within the concave terminal.

16. The system as claimed in claim 11 wherein the concave terminal arched within the encapsulation and not extended beyond the bottom side.

17. The system as claimed in claim 16 further comprising a paddle extended from the bottom side with the integrated circuit over the paddle.

18. The system as claimed in claim 16 further comprising an adhesive with the integrated circuit over the adhesive.

19. The system as claimed in claim 16 further comprising an adhesive with the integrated circuit over the adhesive and the adhesive exposed by the encapsulation.

20. The system as claimed in claim 16 further comprising a paddle extended from the bottom side and not above the bottom side.

* * * * *